(12) United States Patent
Kardasz et al.

(10) Patent No.: US 10,367,136 B2
(45) Date of Patent: Jul. 30, 2019

(54) METHODS FOR MANUFACTURING A PERPENDICULAR MAGNETIC TUNNEL JUNCTION (P-MTJ) MRAM HAVING A PRECESSIONAL SPIN CURRENT INJECTION (PSC) STRUCTURE

(71) Applicant: Spin Memory, Inc.

(72) Inventors: Bartlomiej Adam Kardasz, Pleasanton, CA (US); Jorge Vasquez, San Jose, CA (US); Mustafa Pinarbasi, Morgan Hill, CA (US); Georg Wolf, San Francisco, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,162

(22) Filed: Dec. 29, 2017

(65) Prior Publication Data

US 2019/0207086 A1 Jul. 4, 2019

(51) Int. Cl.
| | | |
|---|---|---|
| *G11C 11/16* | (2006.01) | |
| *H01F 10/32* | (2006.01) | |
| *H01L 43/02* | (2006.01) | |
| *H01L 43/08* | (2006.01) | |
| *H01L 43/10* | (2006.01) | |
| *H01L 43/12* | (2006.01) | |

(52) U.S. Cl.
CPC ............ *H01L 43/02* (2013.01); *G11C 11/161* (2013.01); *H01F 10/3254* (2013.01); *H01F 10/3286* (2013.01); *H01L 43/08* (2013.01); *H01L 43/10* (2013.01); *H01L 43/12* (2013.01); *H01F 10/329* (2013.01)

(58) Field of Classification Search
CPC ......... H01L 43/02; H01L 43/08; H01L 43/10; H01L 43/12; G11C 11/161; H01F 10/3254; H01F 10/3286; H01F 10/329; H01F 10/3295
See application file for complete search history.

(56) References Cited

U.S. PATENT DOCUMENTS

| | | | |
|---|---|---|---|
| 2016/0315249 A1* | 10/2016 | Kardasz | G11C 11/161 |
| 2016/0372656 A1* | 12/2016 | Pinarbasi | H01L 43/08 |
| 2017/0222132 A1* | 8/2017 | Pinarbasi | H01L 43/08 |
| 2018/0223421 A1* | 8/2018 | Wang | C23C 14/3464 |
| 2018/0248110 A1* | 8/2018 | Kardasz | H01L 43/10 |
| 2018/0248113 A1* | 8/2018 | Pinarbasi | H01L 43/08 |

* cited by examiner

*Primary Examiner* — Marc Anthony Armand
*Assistant Examiner* — Younes Boulghassoul
(74) *Attorney, Agent, or Firm* — Zilka-Kotab, P.C.

(57) ABSTRACT

A method for manufacturing a magnetic memory element for use in a magnetic random access memory device to form a MgO spin current coupling layer with improved spin current coupling and reduced device area resistance (RA). The method involves depositing a magnetic free layer structure, and then depositing a MgO spin current coupling layer over the magnetic free layer. The magnetic spin current coupling layer is deposited in a sputter deposition chamber using radio frequency (RF) power. The sputter deposition of the spin current coupling layer can be performed using a MgO target without intervening oxidation steps to form a continuous layer of MgO that is not a multilayer structure of Mg and intermittent oxidation layers. Because the MgO spin transport layer deposited by this RF sputtering does not affect RA of the device, the thickness of the MgO spin transport layer can be adjusted to optimize spin transport performance.

9 Claims, 3 Drawing Sheets

METHODS FOR MANUFACTURING A PERPENDICULAR MAGNETIC TUNNEL JUNCTION (P-MTJ) MRAM HAVING A PRECESSIONAL SPIN CURRENT INJECTION (PSC) STRUCTURE

FIELD OF THE INVENTION

The present invention relates to magnetic random access memory (MRAM), and more particularly to a method for manufacturing a magnetic random access memory element having a precessional spin current injection (PSC) and improved PSC coupling layer.

BACKGROUND

Magnetic Random Access Memory (MRAM) is a non-volatile data memory technology that stores data magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

The present invention provides a magnetic memory element for a magnetic random access memory device. The magnetic memory element includes a magnetic reference layer, a magnetic free layer and a non-magnetic barrier layer located between the magnetic reference layer and the magnetic free layer. The magnetic memory element also includes a magnetic spin current layer and a MgO spin current coupling layer having a Resistance Area product (RA) of no greater than 5 $\Omega\mu m^2$ located between the magnetic spin current layer and the magnetic free layer.

The MgO spin current coupling layer is deposited by RF sputtering method using a MgO target. This deposition process results in a MgO spin current coupling layer that does not affect overall RA of a device as the thickness of the layer changes. This advantageously allows the thickness of the MgO spin current coupling layer to be adjusted for optimal spin current coupling effect without resulting in significant changes in area resistance RA of the device.

The spin current layer can be a material can include one or more of Cobalt (Co), Iron (Fe), Boron (B), Nickel (Ni) and their alloys and has a magnetic anisotropy that is oriented in the plane of the layer. In addition to the magnetic spin current layer and the spin current coupling layer, the magnetic element may also include a magnetic spin transport layer (constructed of a material such as Fe) and a non-magnetic exchange coupling layer (such as Ru) both of which can be located between the MgO spin current coupling layer and the spin current layer.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

The following description includes the best embodiments presently contemplated for carrying out the invention. This description is made for the purpose of illustrating the general principles of this invention and is not meant to limit the inventive concepts claimed herein in any way.

Figure 1:
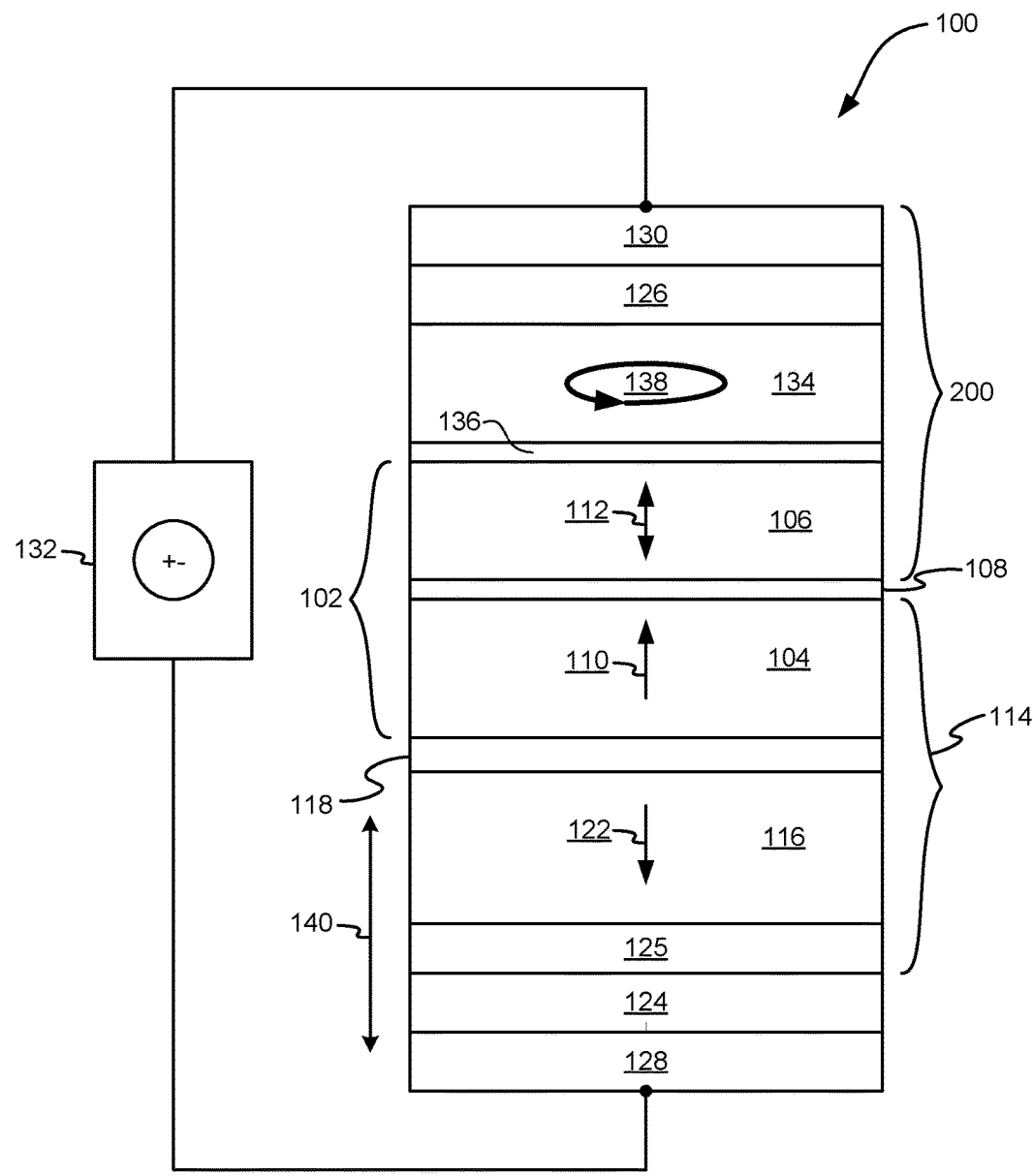
FIG. 1 is a schematic, cross-sectional view of a portion of a magnetic memory element, which may be used in embodiments of the invention.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating barrier layer 108 positioned between the reference layer 104 and the free layer 106 in an element height direction 140. The barrier layer 108 may include an oxide, such as MgO, or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic pinning layer 116 and a non-magnetic, antiparallel coupling layer 118 positioned between the pinning layer 116 and the reference layer 104 in the element height direction 140. The antiparallel coupling layer 118 may comprise any suitable material known in the art, such as Ru, Cr and may be constructed to have a thickness that causes ferromagnetic antiparallel coupling of the pinning layer 116 and the reference layer 104. The antiparallel coupling between the pinning layer 116 and the reference layer 104 pins the magnetization 110 of the reference layer 104 in a second direction opposite to the direction of magnetization 122 of the keeper layer 116.

In another approach, a capping layer 126 may be positioned above the free layer 106 to protect the underlying layers during manufacture, such as during high temperature annealing.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in a downward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the downward direction to an upward direction.

On the other hand, if the magnetization 112 of the free layer 106 is initially in an upward direction in FIG. 1, applying an electrical current through the memory element 100 in an upward direction in FIG. 1 causes electrons to flow in an opposite direction, downward through the memory element 100. Because the magnetization 112 of the free layer 106 is in the same direction as the magnetization 110 of the reference layer 104, the electrons with opposite spin will not be able to pass through the barrier layer 108 into the reference layer 104. As a result, the electrons with opposite spin will accumulate at the junction between the free layer 106 and the barrier layer 108. This accumulation of spin polarized electrons causes a spin torque that causes the magnetization 112 of the free layer 106 to flip from the upward direction to a downward direction.

An under-layer 125 can be located beneath the pinning layer 116. The under-layer can be constructed of a material such as Tantalum (Ta), Tantalum Nitride (TaN) Ruthenium (Ru), Copper (Cu), Copper Nitride (CuN), Platinum (Pt) Cobalt (Co), Nickel (Ni). A seed layer 124 can be positioned below the under-layer 125 in the element height direction 140 to initiate a desired texture and crystallinity in the layers deposited there-above. In addition, a capping aye 126 can be formed at the top of the memory element structure 100 to protect the under-lying layers during fabrication.

In order to assist the switching of the magnetization 112 of the free layer 106, the memory element 100 may include a magnetic spin current structure 134 positioned above the free layer 106. The magnetic spin current structure 134 may be separated from the free layer 106 by a spin current coupling layer 136. The spin magnetic current structure 134 has a magnetic anisotropy that causes it to have a magnetization 138 with a primary component oriented in the in plane direction (e.g., orthogonal to the magnetization 112 of the free layer and the magnetization 110 of the reference layer 104). The magnetization 138 of the magnetic spin current structure 134 may be static in one approach, but preferably moves in a precessional manner as shown in FIG. 1. The magnetization 138 of the magnetic spin current structure 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100. This advantageously increases switching efficiency of a device.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

Figure 2:
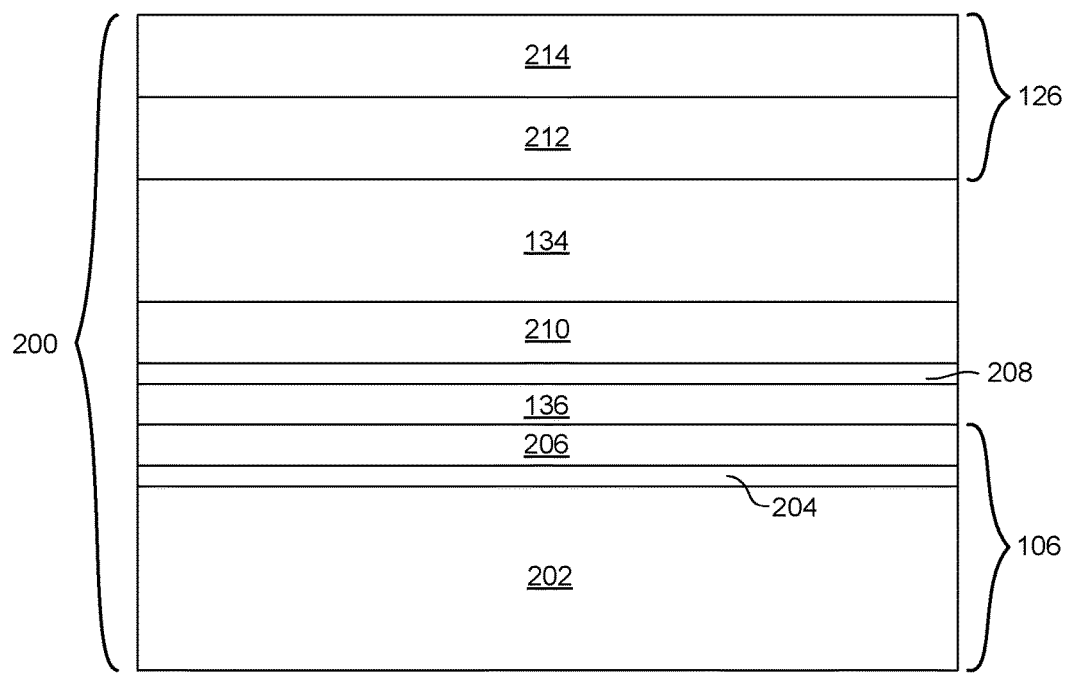
FIG. 2 is an enlarged view of a portion of a portion 200 of the memory element 100 of FIG. 1.

FIG. 2 shows an enlarged view of the region shown in bracket 200 in FIG. 1, in order to describe these layers in greater detail. In FIG. 2 it can be seen that the free layer structure 106 can actually include multiple layers. For example, the free layer 106 can include a first magnetic layer 202, which can be a material such as CoFeB, and a second magnetic layer portion 206, which also can be a material such as CoFeB. A thin layer of a material such as W 204 can be located between the magnetic layers 202, 206. Alternatively, the layer 204 could be located at the very top or bottom of the magnetic free layer structure 106, in which case the remainder of the magnetic free layer structure 106 could be a single magnetic layer.

With continued reference to FIG. 2, the spin current coupling layer 136 is formed on the magnetic free layer structure 106. A novel method for manufacturing the spin current coupling layer 136 and resulting advantageous structural benefits will be described in further detail herein below. A thin, spin transport layer 208 can be formed on the spin current coupling layer 136. The spin transport layer 208 can be a magnetic material such as Fe and preferably has a thickness of 0.4-0.8 nanometers. An exchange coupling layer 210 can be formed over the spin transport layer 208. The coupling layer 210 can be constructed of a material such as Ru and can have a thickness of 0.5-3.0 nanometers. The magnetic spin current layer 134 can be formed on the exchange coupling layer 210. The magnetic spin current layer 134 can be constructed of a material such as CoFeB and can have a thickness of 0.8-5.0 nanometers. The magnetic spin current layer 134 can include other layers (not shown) as well. A protective capping layer structure 126 can be formed over the magnetic spin current layer 134 to protect the spin current layer 134 from damage during manufacturing processes. The capping layer structure 126 can include a layer of Ta or TaN 212 which can have a thickness of about 2 nanometers, and a layer of Ru 214 which can have a thickness of about 10 nanometers.

With continued reference to FIG. 2, the structure and manufacture of the spin current coupling layer 136 will be described in further detail. The spin current coupling layer 136 couples the magnetic free layer structure 106 with the magnetic spin current structure 134 for both magnetic coupling and electron spin transport. MgO is a good choice for the spin current coupling layer 136 because MgO allows for efficient spin polarized transport between the free layer and the spin current structure. Preferably, however, the MgO spin current coupling layer 136 is constructed to provide good transport while also contributing as little area resistance (RA) as possible. A high RA increases switching current, adds to current induced heating and also increases the electrical resistance. Therefore, it is desirable to keep the RA as low as possible.

It is therefore desirable that the spin current coupling layer be constructed to be thin (preferably below 1 nm) and to have good crystalline structure. Therefore, it is desirable that the spin current coupling layer 136 be formed by a process that allows good control of both thickness and crystal structure of the spin current coupling layer 136. MgO-DC process using Mg deposition with subsequent oxidation processes, however, presents challenges to the formation of a MgO spin current coupling layer. MgO-DC process is sensitive to the layers surrounding the MgO layer, which can affect RA and tunnel junction magnetoresistive effect (TMR) of a magnetic random access (MRAM) device. This means that any changes to the surrounding layers (e.g. free layer 106 or layers 208, 210, 134) requires new MgO-DC deposition process parameters, depending on the thickness and material composition of the layers above and below the MgO spin current coupling layer 136. Another challenge presented by MgO-DC process of the MgO spin current coupling layer 136 is that it is difficult to deposit very thin MgO layers. This is because of the deposition of multi-layers of Mg with subsequent oxidation. The resulting thicker MgO coupling layer 136, then, has a negative impact on magnetic coupling, which decreases abruptly with the thickness of the MgO spin current coupling layer.

In order to improve magnetic coupling of the spin current coupling layer 136, the spin current coupling layer can be constructed of MgO deposited by radio frequency (RF) sputtering method, which is much less susceptible to the surrounding environment and allows for a more controlled deposition without increasing area resistance (RA) and without negatively impacting the TMR effect of the device. The MgO spin current coupling layer 136 is deposited in a sputter deposition chamber using a radio frequency (RF) power source directly from at MgO target (as opposed to a Mg target with later oxidation). Because the RF deposition of the MgO coupling layer 136 does not affect the overall RA of the MTJ device to the extent that MgO-DC process would, higher RA values can be tolerated for the MgO PSC coupling layer 136 without affecting overall resistivity of the magnetic element 100. Therefore, there is no resulting increase in switching voltage, allowing the switching currents to be used but with significantly lower RA values. At the same time, a thinner MgO-RF coupling layer with better crystallinity can be formed, which improves magnetic coupling between the spin current coupling layer 134 and the magnetic free layer 106 and which results in higher spin polarization. Higher spin polarization leads to more effective spin torque transfer and improved switching efficiency. Therefore, overall better spin polarization can be achieved using an MgO-RF sputter deposited spin current coupling layer 136 as compared with MgO-DC process for a spin current coupling layer, using an otherwise similar memory element structure 100. In addition, the MgO-RF sputter deposition process for deposition of the MgO coupling layer 136 provides for greater process simplicity and control during the manufacturing process and is more robust to variations in thickness and materials of the surrounding layers, such as the magnetic free layer 106, providing more control during transfer of the spin current coupling layer structure 136 to various magnetic element 100 designs and variations.

Figure 3:
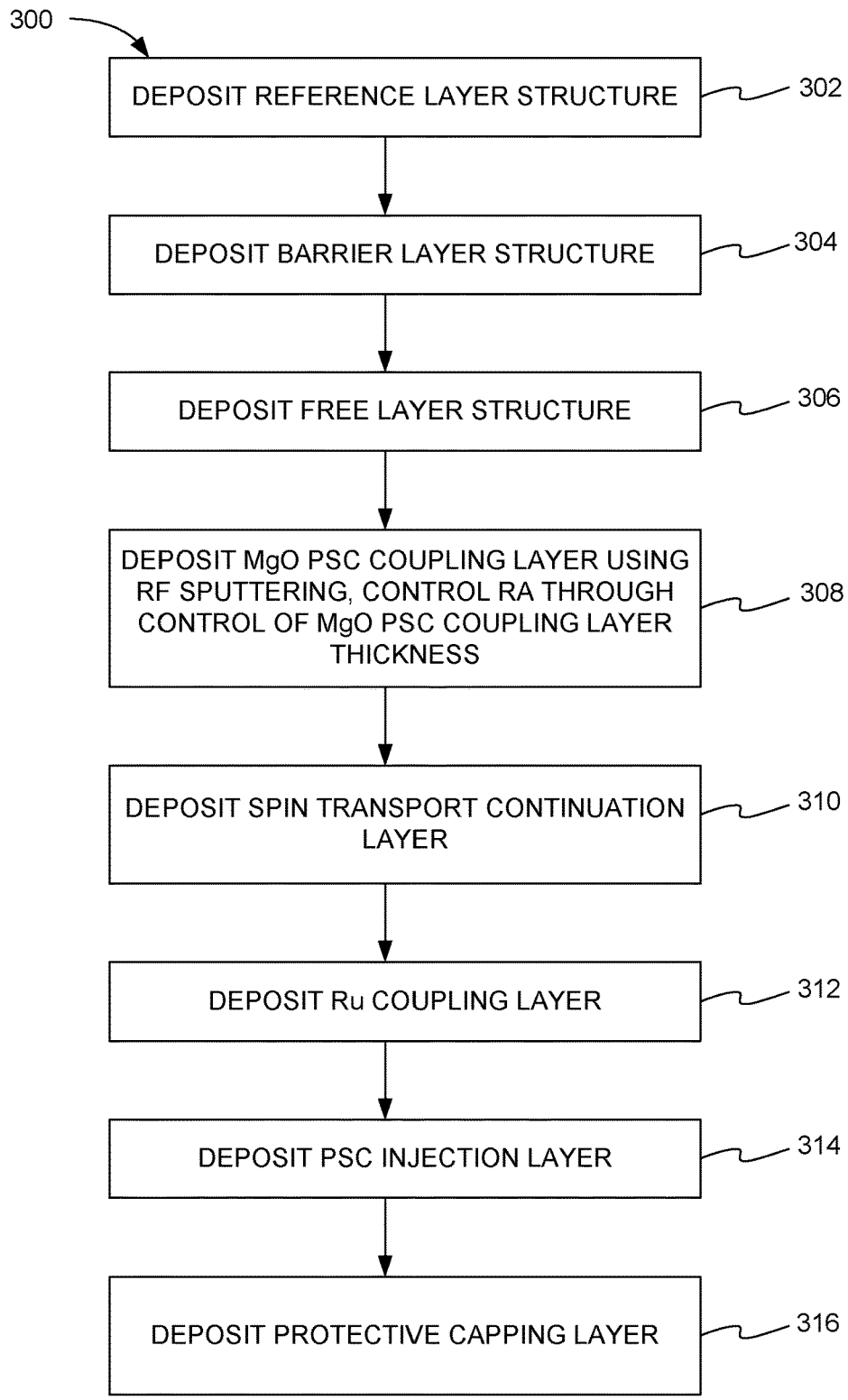
FIG. 3 is a flowchart illustrating a method for manufacturing a magnetic memory element according to an embodiment.

A process 300 for manufacturing a magnetic memory element according to an embodiment is illustrated with reference to FIG. 3. The process 300 begins with a step 302 of depositing a magnetic reference layer structure. As described above, the magnetic reference layer structure can be part of a synthetic anti-ferromagnetic (SAF) structure which can include first and second magnetic layer structures that are anti-parallel coupled across a coupling layer.

In a step 304, a non-magnetic, barrier layer such as MgO can be deposited over the magnetic reference layer. Then, in a step 306 a magnetic free layer structure is deposited over non-magnetic barrier layer structure.

Then, in a step 308 a spin current coupling layer is deposited over the magnetic free layer structure. The spin current coupling layer is deposited to have a resistance area product of not greater than 5 $\Omega\mu m^2$. The spin current coupling layer is a MgO layer that is deposited in a sputter deposition chamber using a radio frequency RF power source. The RF sputtering of the MgO spin current coupling layer is performed using MgO target to directly sputter MgO from the target to the wafer without the need for subsequent oxidation. The thickness of deposition of the MgO spin current coupling layer can be adjusted to achieve a spin polarization of at least 15-30%. For example, the MgO spin current coupling layer can be deposited to a thickness of 0.5-1.5 nm.

Then, in a step 310 a spin transport continuation layer is deposited over the spin current coupling layer. The spin transport continuation layer can be a layer of Fe, which can be deposited to a thickness of 0.4 to –0.8 nanometers. In a step 312 an exchange coupling layer such as Ru is deposited over the spin transport continuation layer. The exchange coupling layer can be a material such as Ru.

Then, in a step 314, a magnetic spin current layer is deposited. The magnetic spin current layer can be a layer of magnetic material such as CoFeB and can be deposited to a thickness of 0.5 to 5 nanometers. Then, in a step 316, a protective capping layer structure can be deposited over the magnetic spin current layer. The capping layer structure can include a layer of Ta or TaN and a layer of Ru. The layer of Ta or TaN can be deposited to a thickness of about 2 nm and the layer of Ru can be deposited to a thickness of about 10 nm. The above described deposition processes of steps 302-316 are preferably performed in-situ in a common deposition chamber without breaking vacuum. The above described process forms a magnetic memory element having a magnet spin current structure with a spin current coupling layer that provides excellent spin current coupling with little to no contribution to or variation in the area resistance RA of the MTJ device.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetic memory element,
the method comprising:
forming a magnetic reference layer structure;
forming a non-magnetic barrier layer over the magnetic reference layer structure;
forming a magnetic free layer structure over the non-magnetic barrier layer;
depositing a MgO spin current coupling layer over the magnetic free layer structure, the MgO spin current coupling layer being deposited in a sputter deposition chamber using a radio frequency sputtering method;
after depositing the MgO spin current coupling layer:
depositing a magnetic spin transport coupling layer over the MgO spin current coupling layer;
depositing a non-magnetic exchange coupling layer comprising Ru over the magnetic spin transport coupling layer; and
depositing a magnetic spin current layer over the non-magnetic exchange coupling layer.

2. The method as in claim 1, wherein the MgO spin current coupling layer is deposited in the sputter deposition chamber using a MgO target.

3. The method as in claim 1, wherein the MgO spin current coupling layer is deposited as a continuous layer of MgO from a MgO target without intervening oxidation steps.

4. The method as in claim 1, wherein the MgO spin current coupling layer is deposited to a thickness of 0.5-1.5 nm.

5. The method as in claim 1, wherein the magnetic spin current layer comprises a magnetic material having a magnetic anisotropy in a direction parallel to the plane of the magnetic spin current layer.

6. The method as in claim 1, wherein the magnetic spin current layer comprises CoFeB.

7. The method as in claim 1, wherein the MgO spin current coupling layer is deposited so as to have a resistance area product of not greater than 5 $\Omega\mu m^2$.

8. A method for manufacturing a magnetic memory element, the method comprising:
forming a magnetic reference layer structure;
forming a non-magnetic barrier layer over the magnetic reference layer structure;
forming a magnetic free layer structure over the non-magnetic barrier layer;
depositing a MgO spin current coupling layer over the magnetic free layer structure, the MgO spin current coupling layer being deposited in a sputter deposition chamber using a radio frequency sputtering method;
after depositing the MgO spin current coupling layer:
depositing a magnetic spin transport coupling layer over the MgO spin current coupling layer;
depositing a non-magnetic exchange coupling layer over the magnetic spin transport coupling layer; and
depositing a magnetic spin current layer over the non-magnetic exchange coupling layer wherein the magnetic spin current layer comprises CoFeB.

9. The method as in claim 1, further comprising, adjusting a thickness of the MgO spin current coupling layer to achieve a spin polarization of at least 15-30%.

\* \* \* \* \*